(12) United States Patent
Zhang et al.

(10) Patent No.: US 10,713,460 B2
(45) Date of Patent: Jul. 14, 2020

(54) DISPLAY PANEL, METHOD FOR MANUFACTURING THE SAME, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Hao Zhang, Beijing (CN); Yanliu Sun, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 151 days.

(21) Appl. No.: 16/120,006

(22) Filed: Aug. 31, 2018

(65) Prior Publication Data
US 2019/0080133 A1    Mar. 14, 2019

(30) Foreign Application Priority Data

Sep. 8, 2017    (CN) .......................... 2017 1 0805659

(51) Int. Cl.
*G06K 9/00* (2006.01)
*G09G 3/3266* (2016.01)
*H01L 27/32* (2006.01)

(52) U.S. Cl.
CPC ........... *G06K 9/0002* (2013.01); *G06K 9/001* (2013.01); *G09G 3/3266* (2013.01); *G09G 2310/0286* (2013.01); *H01L 27/3234* (2013.01)

(58) Field of Classification Search
CPC ..... G06K 9/0002; G06K 9/001; G09G 3/3266
See application file for complete search history.

(56) References Cited

U.S. PATENT DOCUMENTS

| | | | | |
|---|---|---|---|---|
| 2012/0321149 A1* | 12/2012 | Carver | ................. | G06K 9/0004 382/124 |
| 2016/0041663 A1* | 2/2016 | Chen | ..................... | G06F 3/0412 345/174 |
| 2017/0351901 A1* | 12/2017 | Kim | ..................... | G06K 9/0002 |
| 2018/0011598 A1* | 1/2018 | Ku | ......................... | G06F 3/0418 |
| 2018/0033835 A1* | 2/2018 | Zeng | ..................... | G06F 3/0412 |
| 2018/0067606 A1* | 3/2018 | Lee, II | ................... | G06F 3/0416 |

(Continued)

*Primary Examiner* — Utpal D Shah
(74) *Attorney, Agent, or Firm* — Brooks Kushman P.C.

(57) ABSTRACT

A display panel, a method for manufacturing the display panel and a display device are provided. The display panel includes a substrate; a driving circuit on the substrate; an encapsulation film covering the driving circuit and the substrate; and a fingerprint recognition structure and a detection circuit on the encapsulation film, wherein the fingerprint recognition structure includes scan lines in a row direction, detection lines extending in a column direction, and fingerprint recognition circuits, and the scan lines intersect the detection lines to define fingerprint recognition regions; wherein each fingerprint recognition circuit is in one fingerprint recognition region; the driving circuit is connected to the scan lines; the detection circuit is connected to the detection lines and is configured to recognize fingerprints according to electrical signals from the detection lines.

19 Claims, 8 Drawing Sheets

(56) References Cited

U.S. PATENT DOCUMENTS

| | | | | |
|---|---|---|---|---|
| 2018/0314363 A1* | 11/2018 | Yoon | ................ | G06F 3/044 |
| 2019/0034688 A1* | 1/2019 | Lee | ................ | G06K 9/22 |
| 2019/0080131 A1* | 3/2019 | Lee | ................ | G06K 9/0004 |
| 2020/0019804 A1* | 1/2020 | Kim | ................ | G09G 3/32 |

* cited by examiner

DISPLAY PANEL, METHOD FOR MANUFACTURING THE SAME, AND DISPLAY DEVICE

CROSS-REFERENCE TO RELATED APPLICATION

This application claims priority to Chinese Patent Application No. 201710805659.8 filed on Sep. 8, 2017, which is incorporated herein by reference in its entirety.

TECHNICAL FIELD

The present disclosure relates to a field of fingerprint recognition, and particularly, to a display panel, a method for manufacturing the display panel, and a display device including the display panel.

BACKGROUND

Capacitive fingerprint recognition is a type of fingerprint recognition technology used in a display screen with a fingerprint recognition function. The fingerprint recognition function implemented through forming parallel-plate capacitors on a surface of an encapsulation thin film of a flexible display substrate is not provided in the related art, and thus integration cannot be achieved.

SUMMARY

A display panel, a method for manufacturing the display panel and a display device are provided.

In a first aspect, a display panel is provided in the present disclosure, and includes: a display substrate; a fingerprint recognition driving circuit on the display substrate; an encapsulation thin film covering the fingerprint recognition driving circuit and the display substrate; and a fingerprint recognition structure on the encapsulation thin film and a fingerprint recognition detection circuit on the encapsulation thin film, wherein the fingerprint recognition structure includes a plurality of fingerprint recognition scan lines extending in a row direction, a plurality of fingerprint recognition detection lines extending in a column direction, and a plurality of fingerprint recognition circuits; the plurality of fingerprint recognition scan lines intersect the plurality of fingerprint recognition detection lines to define a plurality of fingerprint recognition regions; wherein each of the plurality of fingerprint recognition circuits is in one of the plurality of fingerprint recognition regions corresponding to the fingerprint recognition circuit; the fingerprint recognition driving circuit is connected to the plurality of fingerprint recognition scan lines; the fingerprint recognition detection circuit is connected to the plurality of fingerprint recognition detection lines and is configured to recognize fingerprints according to fingerprint recognition electrical signals from the fingerprint recognition detection lines.

Optionally, the plurality of fingerprint recognition circuits is arranged in multiple rows and multiple columns, each row of fingerprint recognition circuits of the plurality of fingerprint recognition circuits are connected to one of the plurality of fingerprint recognition scan lines, and each column of fingerprint recognition circuits of the plurality of fingerprint recognition circuits are connected to one of the plurality of fingerprint recognition detection lines; each of the fingerprint recognition circuits includes a switch sub-circuit and a fingerprint recognition sub-circuit configured to perform a fingerprint recognition operation, a control terminal of the switch sub-circuit is connected to one of the plurality of fingerprint recognition scan lines to which the fingerprint recognition circuit is connected, a first terminal of the switch sub-circuit is connected to the fingerprint recognition sub-circuit, and a second terminal of the switch sub-circuit is connected to one of the plurality of fingerprint recognition detection lines to which the fingerprint recognition circuit is connected; the fingerprint recognition driving circuit is configured to output fingerprint recognition scan signals to the plurality of fingerprint recognition scan lines, so as to control switch sub-circuits of different rows of fingerprint recognition circuits connected to different fingerprint recognition scan lines to be turned on at different time periods.

Optionally, wherein the switch sub-circuit of each of the plurality of fingerprint recognition circuits includes a switch transistor, and the fingerprint recognition sub-circuit of the fingerprint recognition circuit includes a parallel-plate capacitor; and the parallel-plate capacitor includes a first electrode plate, a second electrode plate, and a dielectric layer between the first electrode plate and the second electrode plate; a gate electrode of the switch transistor is connected to the fingerprint recognition scan line of the plurality of fingerprint recognition scan lines connected to the fingerprint recognition circuit, a first electrode of the switch transistor is connected to the fingerprint recognition detection line of the plurality of fingerprint recognition detection lines connected to the fingerprint recognition circuit, and a second electrode of the switch transistor is connected to the first electrode plate of the parallel-plate capacitor, and the second electrode plate of the parallel-plate capacitor is connected to a common voltage input terminal.

Optionally, wherein a spacing between parallel-plate capacitors of two horizontally-adjacent or vertically-adjacent fingerprint recognition circuits of the plurality of fingerprint recognition circuits is smaller than or equal to a spacing between a furrow and a ridge adjacent to the furrow of a fingerprint.

Optionally, the fingerprint recognition driving circuit is a gate driving circuit for driving gate lines on the display substrate, the gate driving circuit includes a plurality of shift registers cascaded to each other, a gate-driving-signal output terminal of each of the plurality of the shift registers is connected to one of the plurality of the fingerprint recognition scan lines.

Optionally, a first insulation layer is between the plurality of shift registers and the encapsulation thin film, the gate-driving-signal output terminal of each of the plurality of shift registers is connected to the fingerprint recognition scan line through first via holes penetrating through the encapsulation thin film and the first insulation layer.

Optionally, a first conductive layer is between the plurality of shift registers and the encapsulation thin film; a second insulation layer is between the plurality of shift registers and the encapsulation thin film; and a third insulation layer is between the first conductive layer and the encapsulation thin film; the first conductive layer includes a first conductive pattern; gate-driving-signal output terminals of the plurality of shift registers are connected to the first conductive pattern through second via holes penetrating through the second insulation layer, and the first conductive pattern is connected to the plurality of fingerprint recognition scan lines through third via holes penetrating through the encapsulation thin film and the third insulation layer.

Optionally, at least two conductive layers are between the plurality of shift registers and the encapsulation thin film; a fourth insulation layer is between the plurality of shift registers and a second conductive layer of the at least two conductive layers closest to the plurality of shift registers, at least one fifth insulation layer is between the at least two insulation layers, a sixth insulation layer is between the encapsulation thin film and a third conductive layer of the at least two conducive layers closet to the encapsulation thin film; the second conductive layer includes a second conductive pattern, the third conductive layer includes a third conductive pattern, ones of the at least two conductive layers other than the second conductive layer and the third conductive layer include conductive patterns; gate-driving-signal output terminals of the plurality of shift registers are connected to the second conductive pattern through fourth via holes penetrating the fourth insulation layer; the conductive patterns included in the ones of the plurality of two conductive layers other than the second conductive layer and the third conductive layer are connected through fifth via holes penetrating through the at least one fifth insulation layer; and the plurality of fingerprint recognition scan lines are connected to the third conductive pattern through sixth via holes penetrating through the encapsulation thin film and the sixth insulation layer.

Optionally, the first via holes are in a non-display region of the display substrate.

Optionally, both the first electrode plate and the second electrode plate are parallel to the encapsulation thin film.

In a second aspect, a method for manufacturing a display panel is provided in the present disclosure, and includes: manufacturing a plurality of fingerprint recognition scan lines extending in a row direction and a plurality of fingerprint recognition detection lines extending in a column direction on an encapsulation thin film covering a display substrate, wherein the plurality of fingerprint recognition scan lines intersect the plurality of fingerprint recognition detection lines to define a plurality of fingerprint recognition regions; manufacturing a fingerprint recognition circuit in each of the plurality of fingerprint recognition regions, wherein the fingerprint recognition circuit is connected to one of the plurality of fingerprint recognition scan lines and one of the plurality of fingerprint recognition detection lines.

Optionally, the manufacturing a fingerprint recognition circuit in each of the plurality of fingerprint recognition regions, includes: manufacturing a switch transistor and a parallel-plate capacitor in the each of the fingerprint recognition regions; wherein the parallel-plate capacitor includes a first electrode plate, a second electrode plate, and a dielectric layer between the first electrode plate and the second electrode plate; a gate electrode of the switch transistor is connected to the fingerprint recognition scan line connected to the fingerprint recognition circuit, a first electrode of the switch transistor is connected to the fingerprint recognition detection line connected to the fingerprint recognition circuit, and a second electrode of the switch transistor is connected to the first electrode plate of the parallel-plate capacitor; the second electrode plate of the parallel-plate capacitor is connected to a common voltage input terminal.

Optionally, prior to the manufacturing a plurality of fingerprint recognition scan lines extending in a row direction and a plurality of fingerprint recognition detection lines extending in a column direction on the encapsulation thin film covering the display substrate, the method further includes: manufacturing a gate driving circuit on the display substrate; manufacturing a first insulation layer covering the gate driving circuit, and manufacturing the encapsulation thin film covering the first insulation layer; forming first via holes penetrating the first insulation layer and the encapsulation thin film; and wherein after the manufacturing a plurality of fingerprint recognition scan lines extending in a row direction and a plurality of fingerprint recognition detection lines extending in a column direction on the encapsulation thin film covering the display substrate, the method further includes: connecting gate-driving-signal output terminals of the gate driving circuit to the plurality of fingerprint recognition scan lines on the encapsulation thin film through the first via holes penetrating through the first insulation layer and the encapsulation thin film.

Optionally, prior to the manufacturing a plurality of fingerprint recognition scan lines extending in a row direction and a plurality of fingerprint recognition detection lines extending in a column direction on the encapsulation thin film covering the display substrate, the method further includes: manufacturing a gate driving circuit on the display substrate; manufacturing a second insulation layer covering the gate driving circuit, and forming second via holes penetrating through the second insulation layer; forming a first conductive layer on the second insulation layer, patterning the first conductive layer to form a first conductive pattern; and connecting the gate-driving-signal output terminals of the gate driving circuit to the first conductive pattern through the second via holes; and manufacturing a third insulation layer covering the first conductive layer, manufacturing the encapsulation thin film covering the third insulation layer, and forming third via holes penetrating the third insulation layer and the encapsulation thin film; and after the manufacturing a plurality of fingerprint recognition scan lines extending in a row direction and a plurality of fingerprint recognition detection lines extending in a column direction on the encapsulation thin film covering the display substrate, the method further includes: connecting the first conductive pattern to the plurality of fingerprint recognition scan lines on the encapsulation thin film through the third via holes.

Optionally, prior to the manufacturing a plurality of fingerprint recognition scan lines extending in a row direction and a plurality of fingerprint recognition detection lines extending in a column direction on the encapsulation thin film covering the display substrate, the method further includes: manufacturing a gate driving circuit on the display substrate; manufacturing a fourth insulation layer covering the gate driving circuit, and forming fourth via holes penetrating through the fourth insulation layer; forming a second conductive layer on the fourth insulation layer, patterning the second conductive layer to form a second conductive pattern; and connecting gate-driving-signal output terminals of the gate driving circuit to the second conductive pattern through the fourth via holes; manufacturing a fifth insulation layer covering the second conductive pattern, and forming fifth via holes penetrating through the fifth insulation layer; forming a third conductive layer on the fifth insulation layer, patterning the third conductive layer to form a third conductive pattern; and connecting the second conductive pattern to the third conductive pattern through the fifth via holes; manufacturing a sixth insulation layer covering the third conductive layer, manufacturing the encapsulation thin film covering the sixth insulation layer, and forming sixth via holes penetrating the sixth insulation layer and the encapsulation thin film; and after the manufacturing a plurality of fingerprint recognition scan lines extending in a row direction and a plurality of fingerprint recognition detection lines extending in a column direction on the encapsulation thin film covering the display substrate, the method further includes: connecting the third conductive pattern to the plurality of fingerprint recognition scan lines on the encapsulation thin film through the sixth via holes.

Optionally, the first via holes are in a non-display region of the display substrate; the second via holes and the third via holes are in the non-display region of the display substrate; the fourth via holes to the sixth via holes are in the non-display region of the display substrate.

In a third aspect, a display device is provided in the present disclosure, and includes the display panel according to the first aspect.

DETAILED DESCRIPTION

Technical solutions of some embodiments of the present disclosure will be described clearly and completely hereinafter in conjunction with drawings of some embodiments in the present disclosure. Obviously, the described embodiments are only part, but not all, of the embodiments of the present disclosure. All other embodiments obtained by one skilled in the art based on the embodiments of the present disclosure without paying any creative labor fall into the scope of the present disclosure.

All transistors described in the present disclosure may be thin-film transistors, field effect transistors or other devices having similar characteristics. In the embodiments of the present disclosure, in order to differentiate two electrodes other than a gate electrode of a transistor, one of the two electrodes is referred to as a first electrode, and the other of the two electrodes is referred to as a second electrode. In an actual application, the first electrode may be a drain electrode, the second electrode may be a source electrode; or the first electrode may be the source electrode, and the second electrode may be the drain electrode. A "connection" mentioned herein may be a mechanical connection or an electrical connection. "A is connected to B" mentioned herein may mean that the A is mechanically connected to the B directly or the A is mechanically connected to the B through C indirectly, or may mean that the A is electrically connected to the B directly or the A is electrically connected to the B through the C indirectly.

Figure 1:
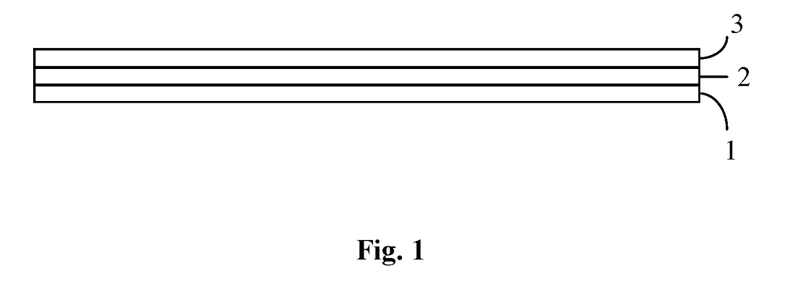
FIG. 1 is a structural schematic diagram of a display panel provided in the present disclosure.

FIG. 1 is a structural schematic diagram of a display panel provided in the present disclosure. The display panel provided in some embodiments of the present disclosure includes a display substrate 1, a fingerprint recognition driving circuit 31 on the display substrate 1, and an encapsulation thin film 2 covering the display substrate 1 and the fingerprint recognition driving circuit 31. The display panel further includes a fingerprint recognition structure 3 and a fingerprint recognition detection circuit 32 on the encapsulation thin film 2. The fingerprint recognition structure 3 includes a plurality of fingerprint recognition scan lines SLs extending in a row direction, a plurality of fingerprint recognition detection lines DLs extending in a column direction, and a plurality of fingerprint recognition circuits 33. The plurality of fingerprint recognition scan lines SLs intersects the plurality of fingerprint recognition detection lines DLs to define a plurality of fingerprint recognition regions RRs. The plurality of fingerprint recognition regions RRs is arranged in a form of a square matrix, i.e., arranged in multiple rows and multiple columns. Each of the plurality of fingerprint recognition circuits 33 is in one of the plurality of fingerprint recognition regions RRs corresponding to the fingerprint recognition circuit.

The plurality of fingerprint recognition scan lines SLs, the plurality of fingerprint recognition DLs, and the plurality of fingerprint recognition circuits 33 are on the encapsulation thin film 2. The fingerprint recognition driving circuit 31 is connected to the plurality of fingerprint recognition scan lines SLs; the fingerprint recognition detection circuit 32 is connected to the plurality of fingerprint recognition detection lines DLs and performs a fingerprint recognition operation according to electrical signals from the plurality of fingerprint recognition detection lines DLs.

The plurality of fingerprint recognition scan lines SLs, the plurality of fingerprint recognition detection lines DLs, and the fingerprint recognition circuits 33 included in the fingerprint recognition structure 3 of the display panel in some embodiments of the present disclosure are on a surface of the encapsulation thin film 2 covering the display substrate 1, and thus the integration is achieved.

In an actual application, the display substrate 1 may a flexible display substrate or another type of display substrate. The type of the display substrate is not limited herein.

Specifically, the plurality of fingerprint recognition circuits 33 is arranged in a form of a square matrix, i.e., arranged in multiple rows and multiple columns. Each row of fingerprint recognition circuits of the plurality of fingerprint recognition circuits 33 are connected to one of the plurality of fingerprint recognition scan lines SLs corresponding to the row of fingerprint recognition circuits, and each column of fingerprint recognition circuits of the plurality of fingerprint recognition circuits are connected to one of the plurality of fingerprint recognition detection lines DLs corresponding to the column of fingerprint recognition circuits. Each of the fingerprint recognition circuits 33 includes a switch sub-circuit 5 and a fingerprint recognition sub-circuit 6 configured to perform the fingerprint recognition operation.

A control terminal of the switch sub-circuit 5 is connected to the fingerprint recognition scan line corresponding to the row of fingerprint recognition circuits in which the fingerprint recognition circuit is, a first terminal of the switch sub-circuit 5 is connected to the fingerprint recognition sub-circuit 6, and a second terminal of the switch sub-circuit 5 is connected to the fingerprint recognition detection line corresponding to the column of fingerprint recognition circuits in which the fingerprint recognition circuit is.

The fingerprint recognition driving circuit 31 is configured to output fingerprint recognition scan signals to the plurality of fingerprint recognition scan lines SLs, so as to control switch sub-circuits connected to different fingerprint recognition scan lines to be turned on at different time periods. Turning on a switch sub-circuit means that the switch sub-circuit is controlled to electrically connect the first terminal of the switch sub-circuit to the second terminal of the switch sub-circuit.

During operation of the display panel in some embodiments of the present, the fingerprint recognition circuits 33 perform the fingerprint recognition operation and obtain fingerprint-recognition electrical signals. The fingerprint recognition driving circuit 31 sends fingerprint recognition scan signals to the fingerprint recognition scan lines to control one or more fingerprint recognition circuits connected to different fingerprint recognition scan lines SLs to output the fingerprint recognition electrical signals to one or more fingerprint recognition detection lines DLs corresponding to the one or more fingerprint recognition circuits at different time periods. The fingerprint recognition detection circuit 32 recognizes one or more fingerprints according to the fingerprint recognition electrical signals from the one or more fingerprint recognition detection lines.

Figure 2:
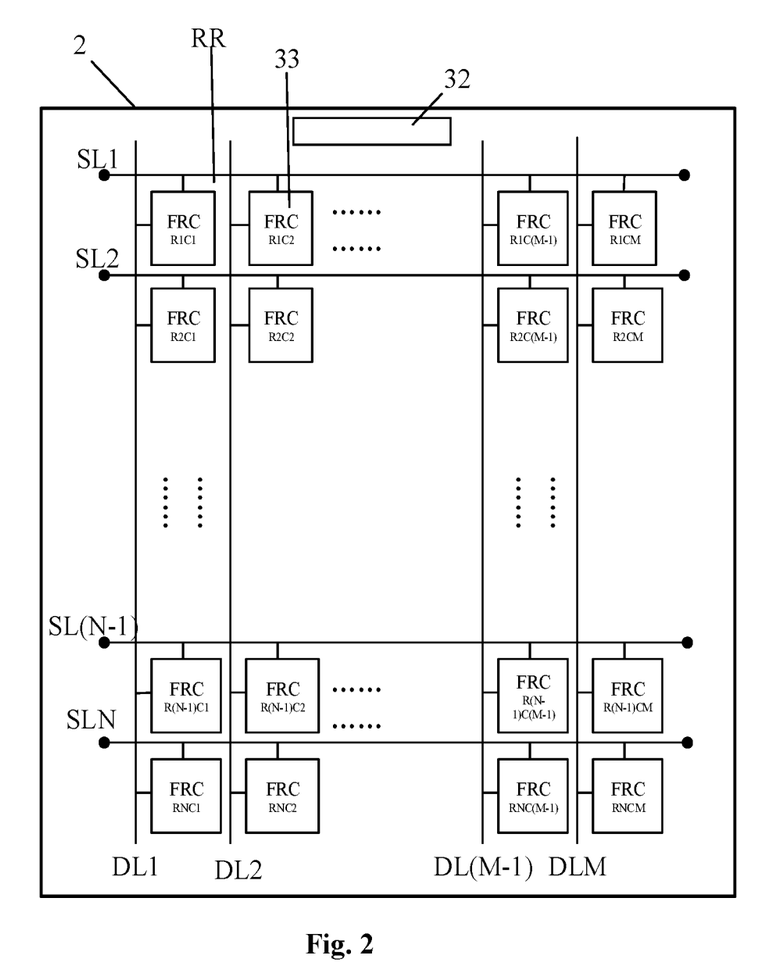
FIG. 2 is a schematic diagram of a fingerprint recognition structure of the display panel provided in the present disclosure.

FIG. 2 is a schematic diagram of the fingerprint recognition structure of the display panel provided in the present disclosure. The fingerprint recognition structure 3 in the display panel provided the present disclosure shown in FIG. 2 includes N fingerprint recognition scan lines SL1, SL2, . . . , SL(N−1), and SLN and M fingerprint recognition detection lines DL1, DL2, . . . , DL(M−1), and DLM, on the encapsulation thin film 2 of the display panel.

Figure 5:
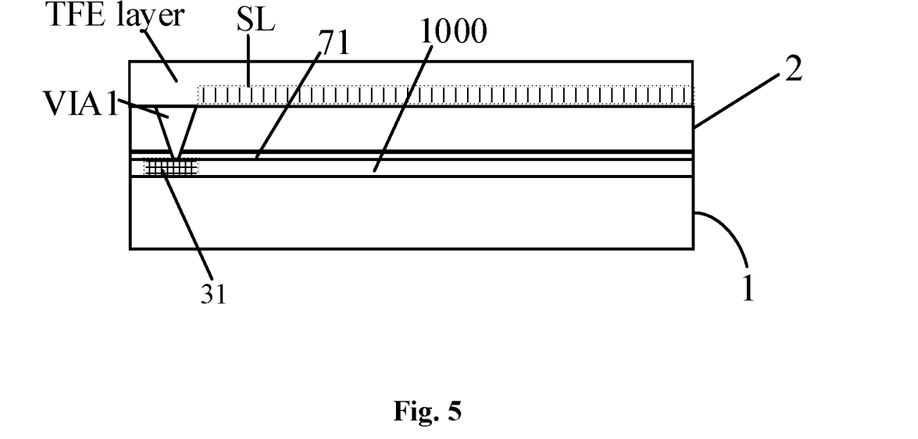
FIGS. 5-7 are schematic diagrams of detailed structures of the display panel provided in the present disclosure.
Figure 6:
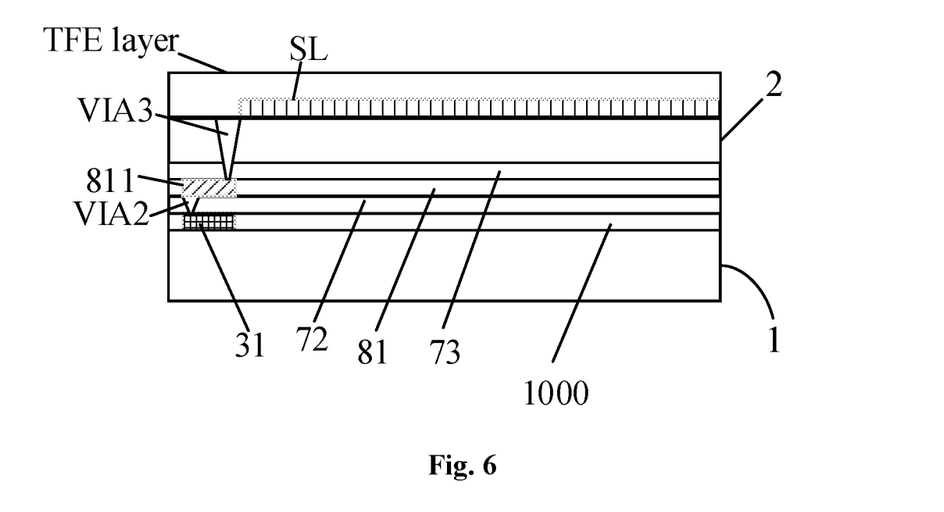
Figure 7:
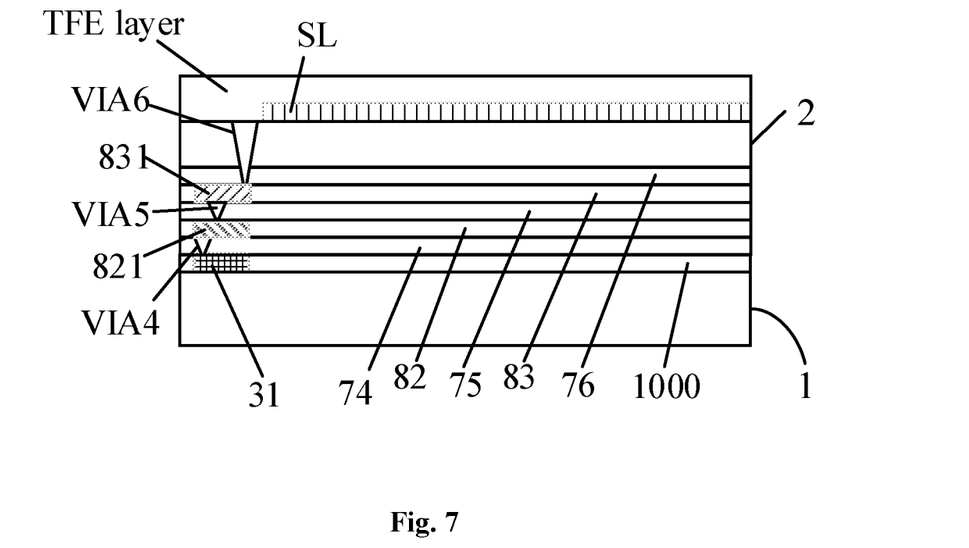

Optionally, the fingerprint recognition structure 3 may be covered by a Thin Film Encapsulation (TFE) layer, as shown in FIG. 5 to FIG. 7. Optionally, the fingerprint recognition detection circuit may also be covered by the TFE layer.

The N fingerprint recognition scan lines intersect the M fingerprint recognition detection lines to define the plurality of fingerprint recognition regions, wherein N and M are positive integers. A quantity of the plurality of fingerprint recognition regions may be N*M. It is noted that, although the N fingerprint recognition scan lines and the M fingerprint recognition detection lines shown in FIG. 2 extend in a horizontal direction and in a vertical direction, respectively, the horizontal direction and the vertical direction shown in FIG. 2 only represent a relative positional relationship between the fingerprint recognition scan lines and the fingerprint recognition detection lines. Therefore, in some embodiments of the present disclosure, the N fingerprint recognition scan lines and the M fingerprint recognition detection lines may extend in the vertical direction and in the horizontal direction, respectively.

Each of the plurality of fingerprint recognition regions is provided with one fingerprint recognition circuit 33. The fingerprint recognition circuit 33 is connected to one of the plurality of fingerprint recognition scan lines corresponding to the fingerprint recognition circuit 33, and is connected to one of the plurality of fingerprint recognition detection lines corresponding to the fingerprint recognition circuit 33. The fingerprint recognition circuit 33 is also on the encapsulation thin film 2.

In an actual application, the fingerprint recognition driving circuit 31 may be implemented by a gate driving circuit included on the display substrate 1 (described below). The fingerprint recognition detection circuit 32 may be any circuit capable of detecting the electrical signals from the fingerprint recognition detection lines. The fingerprint recognition detection circuit 32 may be on a flexible printed circuit (FPC) attached onto a side of the display substrate 1, or may be in a non-display region of the display substrate.

In FIG. 2, a first one of the plurality of fingerprint recognition scan lines is numbered as SL1 and is connected to a first row of fingerprint recognition circuits of the plurality of fingerprint recognition circuits, a second one of the plurality of fingerprint recognition scan lines is numbered as SL2 and is connected to a second row of fingerprint recognition circuits of the plurality of fingerprint recognition circuits, . . . , a (N−1)-th one of the plurality of fingerprint recognition scan lines is numbered as SL(N−1) and is connected to a (N−1)-th row of fingerprint recognition circuits of the plurality of fingerprint recognition circuits, and a N-th one of the plurality of fingerprint recognition scan lines is numbered as SLN and is connected to a N-th row of fingerprint recognition circuits of the plurality of fingerprint recognition circuits. A first one of the plurality of fingerprint recognition detection lines is numbered as DL1 and is connected to a first column of fingerprint recognition circuits of the plurality of fingerprint recognition circuits, a second one of the plurality of fingerprint recognition detection lines is numbered as DL2 and is connected to a second column of fingerprint recognition circuits of the plurality of fingerprint recognition circuits, . . . , a (M−1)-th one of the plurality of fingerprint recognition detection lines is numbered as DL(M−1) and is connected to a (M−1)-th column of fingerprint recognition circuits of the plurality of fingerprint recognition circuits, a M-th one of the plurality of fingerprint recognition detection lines is numbered as DLM and is connected to a M-th column of fingerprint recognition circuits of the plurality of fingerprint recognition circuits, wherein N is an integer larger than or equal to 3, and M is an integer larger than or equal to 3.

In FIG. 2, a fingerprint recognition circuit (abbreviated as FRC) in a first row and a first column is numbered as R1C1 and is connected to the first fingerprint recognition scan line and the first fingerprint recognition detection line; . . . ; a fingerprint recognition circuit in a n-th row and a m-th column is numbered as RnCm and is connected to the n-th fingerprint recognition scan line and the m-th fingerprint recognition detection line, wherein n is an integer larger than or equal to 3 and smaller than or equal to N, m is an integer larger than or equal to 3 and smaller than or equal to M.

Figure 3:
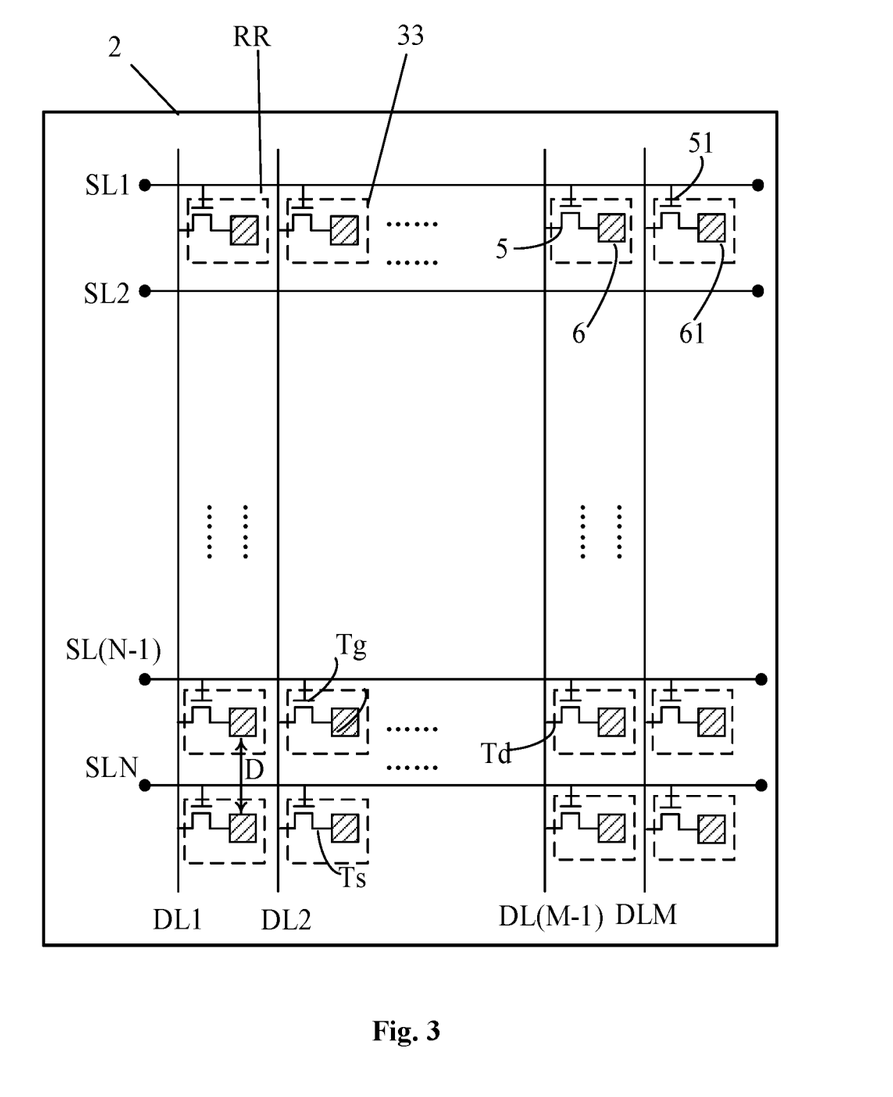
FIG. 3 is another schematic diagram of the fingerprint recognition structure of the display panel provided in the present disclosure.
Figure 4:
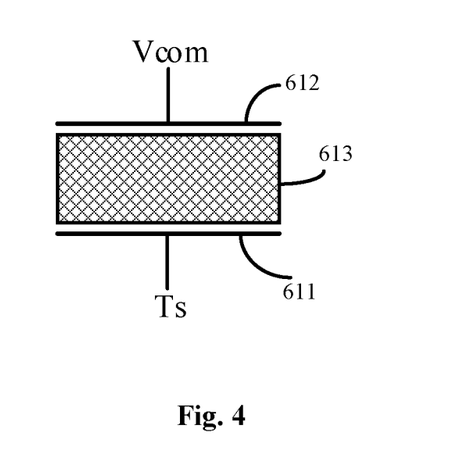
FIG. 4 is a structural schematic diagram of a parallel-plate capacitor in a fingerprint recognition sub-circuit of the display panel provided in the present disclosure.

FIG. 3 is another schematic diagram of the fingerprint recognition structure of the display panel provided in the present disclosure. FIG. 4 is a structural schematic diagram of a parallel-plate capacitor in a fingerprint recognition sub-circuit of the display panel provided in the present disclosure. Referring to FIG. 3, each of the fingerprint recognition circuits 33 may include a switch sub-circuit 5 and a fingerprint recognition sub-circuit 6. The switch sub-circuit 5 includes a switch transistor 51, and the fingerprint recognition sub-circuit 6 includes a parallel-plate capacitor 61. The parallel-plate capacitor 61 includes a first electrode plate 611, a second electrode plate 612, and a dielectric layer 613 between the first electrode plate 611 and the second electrode plate 612, as shown in FIG. 4.

Referring to FIG. 3 and FIG. 4, a gate electrode of the switch transistor 51 is connected to the fingerprint recognition scan line SL connected to the fingerprint recognition circuit, a first electrode of the switch transistor 51 is connected to the fingerprint recognition detection line DL connected to the fingerprint recognition circuit, and a second electrode of the switch transistor 51 is connected to the first electrode plate of the parallel-plate capacitor 61; the second electrode plate of the parallel-plate capacitor 61 is connected to a common voltage input terminal Vcom.

In an actual application, both the first electrode plate and the second electrode plate of the parallel-plate capacitor are parallel to the encapsulation thin film 2 so that when a finger touches the encapsulation thin film, electric charges in the first electrode plate may be discharged.

Specifically, a spacing D between two adjacent parallel-plate capacitors in the row direction or in the column direction is smaller than or equal to a spacing between a ridge and a furrow directly adjacent to the ridge in a fingerprint, so as to recognize the fingerprint.

When a finger gets close to the parallel-plate capacitor, distances between different positions on a skin of the finger and the parallel-plate capacitor are different since the skin of the finger has ridges and furrows having different heights, thus affecting capacitances of various parallel-plate capacitors. By detecting different values of the fingerprint recognition electrical signals from the fingerprint recognition detection lines, a two-dimensional pattern of the fingerprint having the ridges and the furrows of the finger may be detected and the fingerprint may be recognized. Since each of the parallel-plate capacitors needs to detect whether a ridge of the finger is above the parallel-plate capacitor or a furrow of the finger is above the parallel-plate capacitor, the spacing between two adjacent parallel-plate capacitors in the row direction or in the column direction is smaller than or equal to the spacing between a ridge and a furrow directly adjacent to the ridge in a fingerprint, so as to recognize the fingerprint.

In an actual application, the fingerprint recognition driving circuit 31 is configured to send fingerprint recognition scan signals to the fingerprint recognition scan lines corresponding to the fingerprint recognition driving circuit 31, so that switch transistors connected to the fingerprint recognition scan lines may be controlled to be turned on at different periods, and which row or which rows of parallel-plate transistors are touched may be identified.

Optionally, the fingerprint recognition driving circuit 31 may be a gate driving circuit included on the display substrate 1. The gate driving circuit is in a layer 1000 for achieving a display function on the display substrate 1. The gate driving circuit may include a plurality of shift registers cascaded to each other. A gate-driving-signal output terminal of each of the plurality of shift registers is connected to one of the plurality of fingerprint recognition scan lines SLs corresponding to the shift register. Optionally, the gate driving circuit included on the display substrate 1 may be used as the fingerprint recognition driving circuit, to reduce wirings and circuits at a peripheral region of the display substrate and achieve a frame design having a narrow rim.

Optionally, referring to FIG. 5, FIG. 5 is a schematic diagram of a detailed structure of the display panel provided in the present disclosure. A first insulation layer 7 is arranged between the plurality of shift registers and the encapsulation thin film 2, and gate-driving-signals output terminals of the plurality of shift registers are connected to the fingerprint recognition scan lines SLs through first via holes VIA1 penetrating through the encapsulation thin film 2 and the first insulation layer 7.

Optionally, referring to FIG. 6, FIG. 6 is another schematic diagram of the detailed structure of the display panel provided in the present disclosure. A first conductive layer 81 is between the plurality of shift registers and the encapsulation thin film 2; a second insulation layer 72 is between the plurality of shift registers and the first conductive layer 81; and a third insulation layer 73 is between the first conductive layer 81 and the encapsulation thin film 2. The first conductive layer 81 includes a first conductive pattern 811, the gate-driving-signal output terminals of the plurality of shift registers are connected to the first conductive pattern 811 through second via holes VIA2 penetrating through the second insulation layer 72, and the first conductive pattern 811 is connected to the plurality of fingerprint recognition scan lines SLs through third via holes VIA3 penetrating through the third insulation layer 72 and the encapsulation thin film 2.

Optionally, referring to FIG. 7, FIG. 7 is another schematic diagram of the detailed structure of the display panel provided in the present disclosure. At least two conductive layers 82 and 83 are between the plurality of shift registers and the encapsulation thin film. A fourth insulation layer 74 is between the plurality of shift registers and a second conductive layer 82 of the at least two conductive layers closest to the plurality of shift registers; a fifth insulation layer 75 is between the at least two conductive layers 82 and 83 of the at least two conductive layers; a sixth insulation layer 76 is between the encapsulation thin film 2 and a third conductive layer 83 of the at least two conductive layers closest to the encapsulation thin film 2. The second conductive layer 82 includes a second conductive pattern 821 and the third conductive layer 83 includes a third conductive pattern 831. The gate-driving-signal output terminals of the plurality of shift registers are connected to the second conductive pattern 821 of the second conductive layer 82 closest to the plurality of shift registers through fourth via holes VIA4 penetrating through the fourth insulation layer 74; the second conductive pattern 821 and the third conductive pattern 831 are connected through fifth via holes VIA5 penetrating through the fifth insulation layer 75; and the fingerprint recognition scan lines are connected to the third conductive pattern 831 of the third conductive layer 83 closest to the encapsulation thin film 2 through sixth via holes VIA6 penetrating through the sixth insulation layer 76 and the encapsulation thin film 2.

In an actual application, since the plurality of shift registers included in the gate driving circuit are generally in the non-display region of the display substrate, not in an effective display region of the display substrate, the via holes VIA1-VIA6 for connecting the gate-driving-signal output terminals and the fingerprint recognition scan lines may also be in the non-display region of the display substrate.

In an actual application, in the non-display region of the display substrate, one or more conductive layer may also be arranged between the gate driving circuit and the encapsulation thin film 2 besides one or more insulation layers. The conductive layers may be ITO (Indium tin oxide) layers, source-drain metal layers, gate metal layers or other conductive layers. In some embodiments of the present disclosure, the one or more conductive layers may be used to transfer the gate driving signals from the gate driving circuit upwards, to thereby implement better electrical contact.

Specifically, the display substrate 1 may be an Organic Light Emitting Diode (OLED) display substrate.

Referring back to FIG. 3, the fingerprint recognition structure of the display panel shown in FIG. 3 of the present disclosure includes the N fingerprint recognition scan lines extending in the row direction and the M fingerprint recognition detection lines extending in the column direction on the encapsulation thin film 2 on the display substrate, and the N fingerprint recognition scan lines intersect the M fingerprint recognition scan lines to define the plurality of fingerprint recognition regions.

Each of the fingerprint recognition regions is provided with one of the plurality of fingerprint recognition circuits, and plurality of the fingerprint recognition circuits are also on the encapsulation thin film. Each of the plurality of fingerprint recognition circuits is connected to one of the N fingerprint recognition scan lines and one of the M fingerprint recognition detection lines. Each of the fingerprint recognition circuit includes the switch transistor 51 and the parallel-plate capacitor 61. The parallel-plate capacitor 61 includes the first electrode plate 611 and the second electrode plate 612. The dielectric layer 613 is between the first electrode plate 611 and the second electrode plate 612. The gate electrode Tg of the switch transistor 51 is connected to the fingerprint recognition scan line connected to the fingerprint recognition circuit, the drain electrode Td of the switch transistor 51 is connected to the fingerprint recognition detection line connected to the fingerprint recognition circuit, and the source electrode Ts of the switch transistor 51 is connected to the first electrode plate 611. The second electrode plate 612 is connected to a common voltage input terminal Vcom. Both the first electrode plate 611 and the second electrode plate 612 are parallel to the encapsulation thin film 2.

For example, in FIG. 3, the gate electrode Tg of the switch transistor 51 included in the fingerprint recognition circuit in the first row and in the first column is connected to the first fingerprint recognition scan line SL1, the source electrode Ts of the switch transistor 51 is connected to the first fingerprint recognition detection line DL1, and the drain electrode Td of the switch transistor 51 is connected to the first electrode plate 611 of the parallel-plate capacitor 61 of the fingerprint recognition circuit in the first row and in the first column, and the second electrode plate 612 of the parallel-plate capacitor 61 is connected to the common voltage input terminal Vcom. The common voltage input terminal Vom is inputted with a Direct Current (DC) voltage. For example, the common voltage input terminal may be inputted with a ground (Gnd) voltage.

The switch transistors 51 shown in FIG. 3 are N-type transistors (such as N-Metal-Oxide-Semiconductor (NMOS) transistors). In an actual application, the switch transistors 51 may also be P-type transistors (such as P-Metal-Oxide-Semiconductor (PMOS) transistors) or Metal-Oxide-Semiconductor Field-Effect-Transistors (MOSFET).

In an actual application, the N fingerprint recognition scan lines may be scanned row by row so that the switch transistors 51 connected to the N fingerprint recognition scan lines may be turned on row by row.

The fingerprint recognition structures in the display panel provided in some embodiments of the present disclosure include capacitive fingerprint recognition circuits. Each of the capacitive fingerprint recognition circuits includes the switch transistor (the switch transistor may be a switch Thin Film Transistor (TFT) device) and the parallel-plate capacitor used for sensing fingerprints. The electrodes plates of the parallel-plate capacitor are formed by transparent ITO (Indium Tin Oxides). The switch transistor may be the same type as transistors used for display in the display panel. For example, the switch transistors in the fingerprint recognition structure and the transistors used for display may be the P-type TFTs which are manufactured by a low temperature process. A scan signal inputted through the gate electrode of the switch transistor may be provided through the gate driving circuit (such as a Gate Driver On Array (GOA) on an array substrate) on the display substrate. In an actual application, the scan signal outputted by the GOA may be transmitted upwards to the fingerprint recognition scan line through several via holes penetrating through several insulation layers and the encapsulation thin film. If thicknesses of the insulation layers are large and thus the via holes are deep, several metal layers or layers made of ITO may be added for transmitting the scan signal upwards from the GOA, to thereby increasing electrical contact.

FIGS. 8-11 are flowcharts of a method for manufacturing the display panel of the present disclosure. The method for manufacturing the display panel shown in FIGS. 8-11 may be used to manufacture the display panel shown in FIGS. 5-7.

Figure 8:
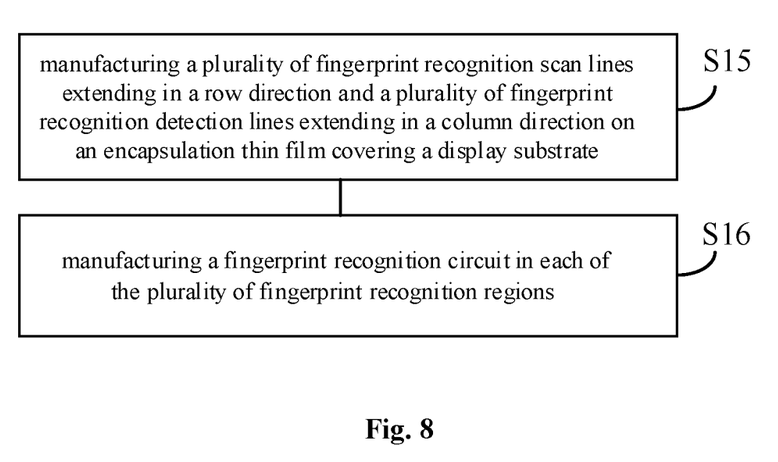
FIGS. 8-11 are flowcharts of a method for manufacturing a display panel provided in the present disclosure.

The method for manufacturing the display panel may include the following steps in FIG. 8.

Step S15: manufacturing a plurality of fingerprint recognition scan lines extending in a row direction and a plurality of fingerprint recognition detection lines extending in a column direction on an encapsulation thin film covering a display substrate, wherein the plurality of fingerprint recognition scan lines intersects the plurality of fingerprint recognition detection lines to define a plurality of fingerprint recognition regions, and the plurality of fingerprint recognition regions are arranged in multiple rows and multiple columns.

Step S16: manufacturing a fingerprint recognition circuit in each of the plurality of fingerprint recognition regions.

Specifically, the step S16 of manufacturing a fingerprint recognition circuit in each of the plurality of fingerprint recognition regions may include manufacturing a switch transistor and a parallel-plate capacitor in the each of the plurality of fingerprint recognition regions; wherein the parallel-plate capacitor includes the first electrode plate, the second electrode plate, and the dielectric layer between the first electrode plate and the second electrode plate; a gate electrode of the switch transistor is connected to a fingerprint recognition scan line connected to the fingerprint recognition circuit, a first electrode of the switch transistor is connected to the fingerprint recognition detection line connected to the fingerprint recognition circuit, and a second electrode of the switch transistor is connected to the first electrode plate of the parallel-plate capacitor; the second electrode plate of the parallel-plate capacitor is connected to a common voltage input terminal Vcom.

Optionally, the fingerprint recognition circuit may be a gate driving circuit on the display substrate; the gate driving circuit includes a plurality of shift registers cascaded to each other; a first insulation layer is between the gate driving circuit and the encapsulation thin film, prior to the step S15, the method for manufacturing the display panel further includes: manufacturing first via holes penetrating through the encapsulation thin film and the first insulation layer, and after the step S15 and before the step S16, the method for manufacturing the display panel further includes connecting gate-driving-signal output terminals of the plurality of shift registers to the plurality of fingerprint recognition scan lines through the first via holes.

Figure 9:
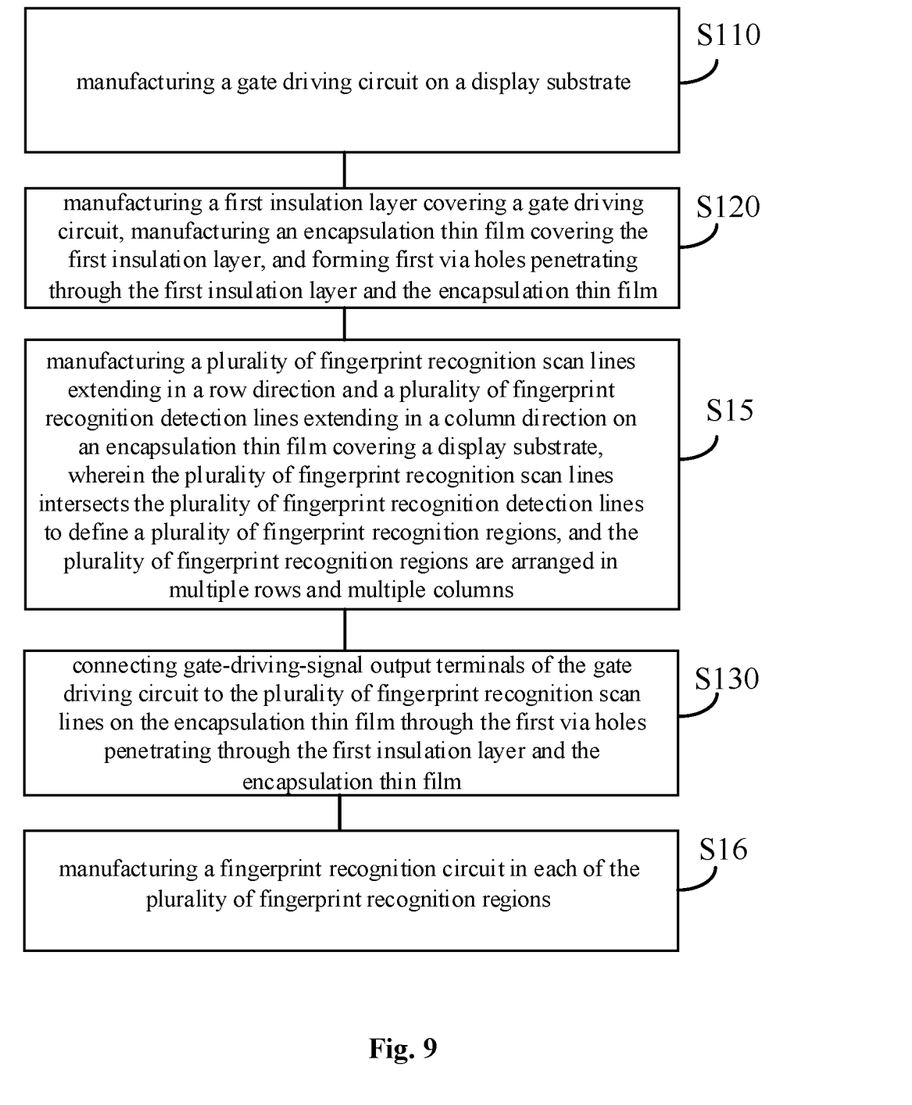

Optionally, referring to FIG. 9, the fingerprint recognition driving circuit may be the gate driving circuit included on the display substrate. The gate driving circuit includes the plurality of shift registers cascaded to each other. Prior to the step S15 of manufacturing a plurality of fingerprint recognition scan lines extending in a row direction and a plurality of fingerprint recognition detection lines extending in a column direction on an encapsulation thin film covering a display substrate, the method for manufacturing a display panel further includes steps S110-S120.

Step S110: manufacturing the gate driving circuit on the display substrate.

Step S120: manufacturing a first insulation layer covering the gate driving circuit, manufacturing the encapsulation thin film covering the first insulation layer, and forming first via holes penetrating through the first insulation layer and the encapsulation thin film.

After the step S15 and before the step S16, the method for manufacturing a display panel further includes a step S130.

Step S130: connecting gate-driving-signal output terminals of the gate driving circuit to the plurality of fingerprint recognition scan lines on the encapsulation thin film through the first via holes penetrating through the first insulation layer and the encapsulation thin film.

Figure 10:
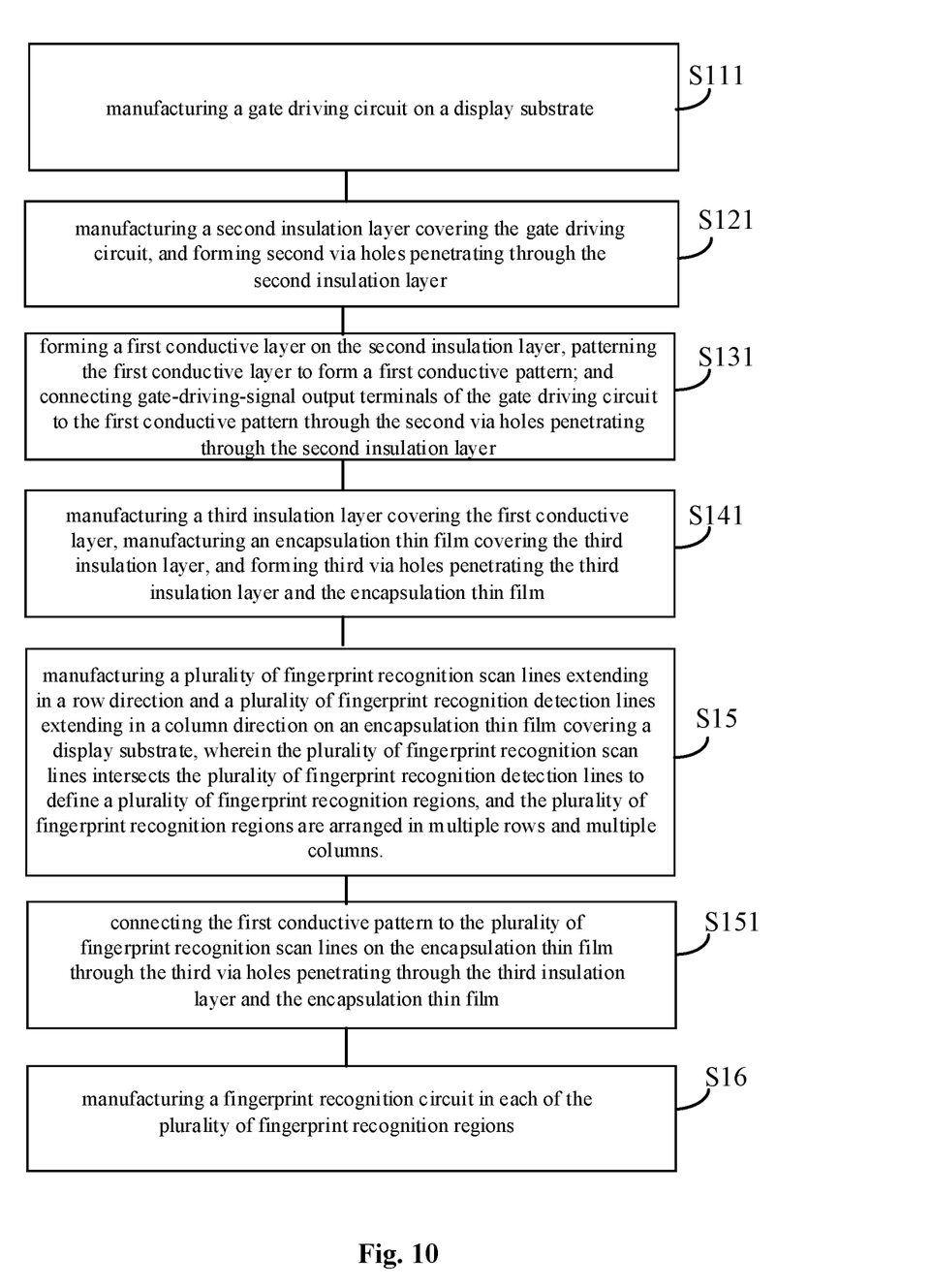

Optionally, referring to FIG. 10, the fingerprint recognition driving circuit may be the gate driving circuit on the display substrate; the gate driving circuit includes the plurality of shift registers cascaded to each other. Prior to the step S15 of manufacturing a plurality of fingerprint recognition scan lines extending in a row direction and a plurality of fingerprint recognition detection lines extending in a column direction on the encapsulation thin film covering the display substrate, the method for manufacturing a display panel further includes steps S111-S141.

Step S111: manufacturing the gate driving circuit on the display substrate.

Step S121: manufacturing a second insulation layer covering the gate driving circuit, and forming second via holes penetrating through the second insulation layer.

Step S131: forming a first conductive layer on the second insulation layer, patterning the first conductive layer to form a first conductive pattern; and connecting the gate-driving-signal output terminals of the gate driving circuit to the first conductive pattern through the second via holes penetrating through the second insulation layer.

Step S141: manufacturing a third insulation layer covering the first conductive layer, manufacturing the encapsulation thin film covering the third insulation layer, and forming third via holes penetrating the third insulation layer and the encapsulation thin film.

After the step S15 and before the step S16, the method further includes a step S151.

Step S151: connecting the first conductive pattern to the plurality of fingerprint recognition scan lines on the encapsulation thin film through the third via holes penetrating through the third insulation layer and the encapsulation thin film.

Figure 11:
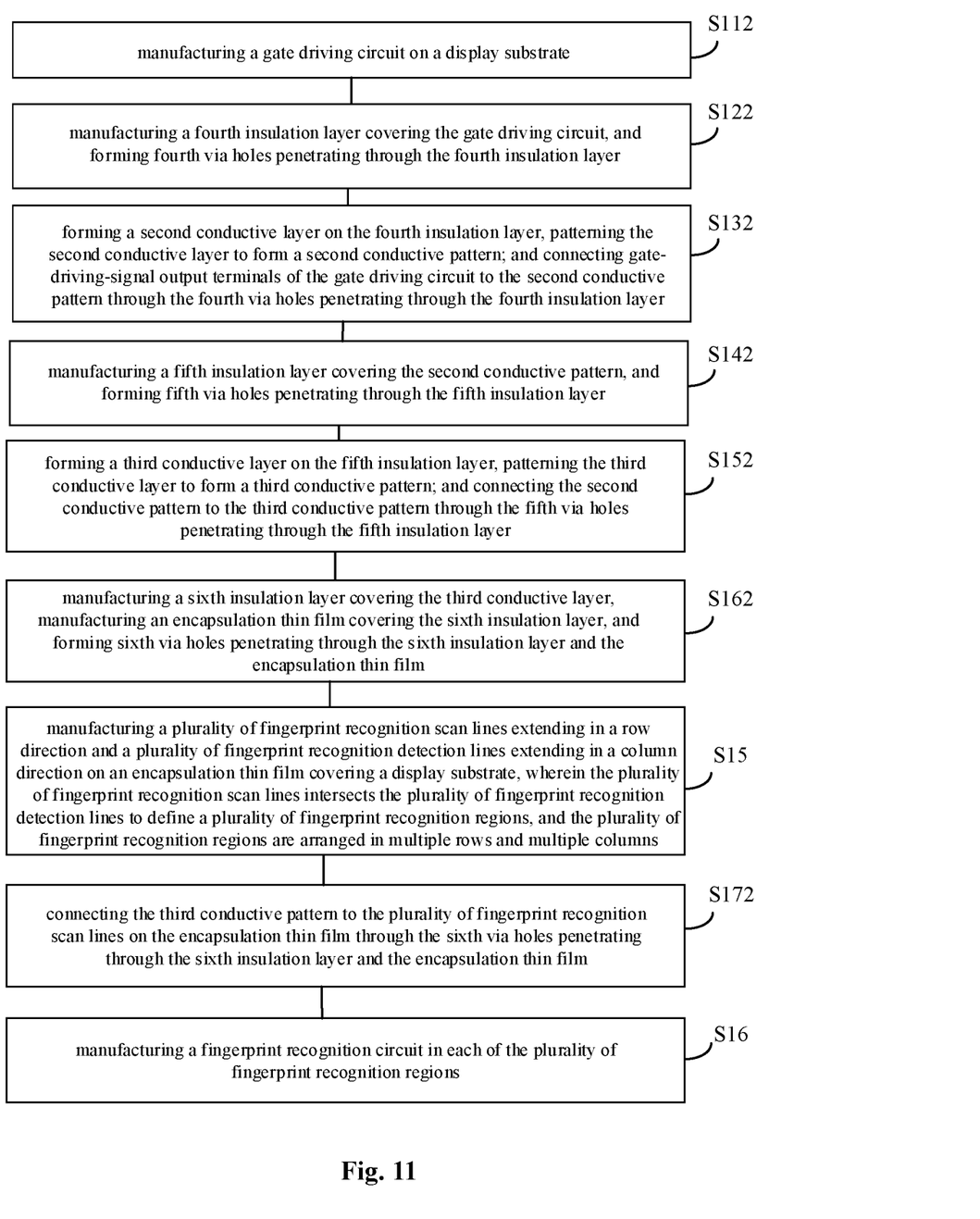

Optionally, referring to FIG. 11, the fingerprint recognition driving circuit may be the gate driving circuit included on the display substrate; the gate driving circuit includes the plurality of shift registers cascaded to each other. Prior to the step S15 of manufacturing a plurality of fingerprint recognition scan lines extending in a row direction and a plurality of fingerprint recognition detection lines extending in a column direction on an encapsulation thin film covering the display substrate, the method for manufacturing a display panel further includes steps S112-S162.

Step S112: manufacturing the gate driving circuit on the display substrate.

Step S122: manufacturing a fourth insulation layer covering the gate driving circuit, and forming fourth via holes penetrating through the fourth insulation layer.

Step S132: forming a second conductive layer on the fourth insulation layer, patterning the second conductive layer to form a second conductive pattern; and connecting gate-driving-signal output terminals of the gate driving circuit to the second conductive pattern through the fourth via holes penetrating through the fourth insulation layer.

Step S142: manufacturing a fifth insulation layer covering the second conductive pattern, and forming fifth via holes penetrating through the fifth insulation layer.

Step S152: forming a third conductive layer on the fifth insulation layer, patterning the third conductive layer to form a third conductive pattern; and connecting the second conductive pattern to the third conductive pattern through the fifth via holes penetrating through the fifth insulation layer.

Step S162: manufacturing a sixth insulation layer covering the third conductive layer, manufacturing the encapsulation thin film covering the sixth insulation layer, and forming sixth via holes penetrating through the sixth insulation layer and the encapsulation thin film.

After the step S15 and before the step S16, the method further includes a step S172.

Step S172: connecting the third conductive pattern to the plurality of fingerprint recognition scan lines on the encapsulation thin film through the sixth via holes penetrating through the sixth insulation layer and the encapsulation thin film.

In an actual application, since the plurality of shift registers included in the gate driving circuit are generally in the non-display region of the display substrate, not in the effective display region of the display substrate, the first to sixth via holes for connecting the gate-driving-signal output terminals and the fingerprint recognition scan lines may also be in the non-display region of the display substrate.

In an actual application, in the non-display region of the display substrate, one or more conductive layers may also be arranged between the gate driving circuit and the encapsulation thin film besides the insulation layers. The conductive layers may be ITO layers, source-drain metal layers, gate metal layers or other conductive layers. In some embodiments of the present disclosure, the one or more conductive layer may be used to transfer the electrical signals from the gate driving circuit upwards, to thereby implement better electrical contact.

Optionally, the conductive layers or the conductive patterns in the present disclosure are in the non-display region of the display substrate.

In some embodiments of the present disclosure, a display device including the above display panel is provided.

The display device provided in some embodiments of the present disclosure implements a fingerprint recognition function through forming parallel-plate capacitors on a surface of the encapsulation thin film of the display substrate, and thus the integration is achieved.

The display device provided in the present disclosure may be any product or component having a display function, such as a mobile phone, a tablet, a television, a display, a laptop, a digital frame, and a navigator.

It should be noted that sequences of the steps described do not represent the steps have to be performed in the sequences herein. Therefore, one step may be performed before another step subsequent to the step in the Figures of the present disclosure. For example, the step S130 may be performed after the step S16, the step S151 may be performed after the step S16, and the step S172 may be performed after the step S16. Thus, although variations of the sequences of the steps conceivable by one skilled in the art are not provided in the present disclosure, the variations of the sequences of the steps also fall within the scope of the present disclosure.

The above are optional embodiments of the present disclosure. It should be noted that numerous modifications and embellishments may be made by one of ordinary skills in the art without departing from the spirit of the present disclosure, and such modifications and embellishments also fall within the scope of the present disclosure.

What is claimed is:

1. A display panel, comprising:
    a display substrate;
    a fingerprint recognition driving circuit on the display substrate;
    an encapsulation thin film covering the fingerprint recognition driving circuit and the display substrate; and
    a fingerprint recognition structure on the encapsulation thin film and a fingerprint recognition detection circuit on the encapsulation thin film, wherein the fingerprint recognition structure comprises a plurality of fingerprint recognition scan lines extending in a row direction, a plurality of fingerprint recognition detection lines extending in a column direction, and a plurality of fingerprint recognition circuits; the plurality of fingerprint recognition scan lines intersect the plurality of fingerprint recognition detection lines to define a plurality of fingerprint recognition regions;

wherein each of the plurality of fingerprint recognition circuits is in one of the plurality of fingerprint recognition regions corresponding to the fingerprint recognition circuit;

the fingerprint recognition driving circuit is connected to the plurality of fingerprint recognition scan lines;

the fingerprint recognition detection circuit is connected to the plurality of fingerprint recognition detection lines and is configured to recognize fingerprints according to fingerprint recognition electrical signals from the fingerprint recognition detection lines.

2. The display panel according to claim 1, wherein the plurality of fingerprint recognition circuits is arranged in multiple rows and multiple columns, each row of fingerprint recognition circuits of the plurality of fingerprint recognition circuits are connected to one of the plurality of fingerprint recognition scan lines, and each column of fingerprint recognition circuits of the plurality of fingerprint recognition circuits are connected to one of the plurality of fingerprint recognition detection lines;

each of the fingerprint recognition circuits comprises a switch sub-circuit and a fingerprint recognition sub-circuit configured to perform a fingerprint recognition operation, a control terminal of the switch sub-circuit is connected to one of the plurality of fingerprint recognition scan lines to which the fingerprint recognition circuit is connected, a first terminal of the switch sub-circuit is connected to the fingerprint recognition sub-circuit, and a second terminal of the switch sub-circuit is connected to one of the plurality of fingerprint recognition detection lines to which the fingerprint recognition circuit is connected;

the fingerprint recognition driving circuit is configured to output fingerprint recognition scan signals to the plurality of fingerprint recognition scan lines, so as to control switch sub-circuits of different rows of fingerprint recognition circuits connected to different fingerprint recognition scan lines to be turned on at different time periods.

3. The display panel according to claim 2, wherein the switch sub-circuit of each of the plurality of fingerprint recognition circuits comprises a switch transistor, and the fingerprint recognition sub-circuit of the fingerprint recognition circuit comprises a parallel-plate capacitor; and the parallel-plate capacitor comprises a first electrode plate, a second electrode plate, and a dielectric layer between the first electrode plate and the second electrode plate;

a gate electrode of the switch transistor is connected to the fingerprint recognition scan line of the plurality of fingerprint recognition scan lines connected to the fingerprint recognition circuit, a first electrode of the switch transistor is connected to the fingerprint recognition detection line of the plurality of fingerprint recognition detection lines connected to the fingerprint recognition circuit, and a second electrode of the switch transistor is connected to the first electrode plate of the parallel-plate capacitor, and the second electrode plate of the parallel-plate capacitor is connected to a common voltage input terminal.

4. The display panel according to claim 3, wherein a spacing between parallel-plate capacitors of two horizontally-adjacent or vertically-adjacent fingerprint recognition circuits of the plurality of fingerprint recognition circuits is smaller than or equal to a spacing between a furrow and a ridge adjacent to the furrow of a fingerprint.

5. The display panel according to claim 2, wherein the fingerprint recognition driving circuit is a gate driving circuit for driving gate lines on the display substrate, the gate driving circuit comprises a plurality of shift registers cascaded to each other, a gate-driving-signal output terminal of each of the plurality of the shift registers is connected to one of the plurality of the fingerprint recognition scan lines.

6. The display panel according to claim 5, wherein, a first insulation layer is between the plurality of shift registers and the encapsulation thin film, the gate-driving-signal output terminal of each of the plurality of shift registers is connected to the fingerprint recognition scan line through first via holes penetrating through the encapsulation thin film and the first insulation layer.

7. The display panel according to claim 5, wherein, a first conductive layer is between the plurality of shift registers and the encapsulation thin film; a second insulation layer is between the plurality of shift registers and the encapsulation thin film; and a third insulation layer is between the first conductive layer and the encapsulation thin film; the first conductive layer comprises a first conductive pattern; gate-driving-signal output terminals of the plurality of shift registers are connected to the first conductive pattern through second via holes penetrating through the second insulation layer, and the first conductive pattern is connected to the plurality of fingerprint recognition scan lines through third via holes penetrating through the encapsulation thin film and the third insulation layer.

8. The display panel according to claim 5, wherein, at least two conductive layers are between the plurality of shift registers and the encapsulation thin film; a fourth insulation layer is between the plurality of shift registers and a second conductive layer of the at least two conductive layers closest to the plurality of shift registers, at least one fifth insulation layer is between the at least two insulation layers, a sixth insulation layer is between the encapsulation thin film and a third conductive layer of the at least two conducive layers closet to the encapsulation thin film; the second conductive layer comprises a second conductive pattern, the third conductive layer comprises a third conductive pattern, ones of the at least two conductive layers other than the second conductive layer and the third conductive layer comprise conductive patterns; gate-driving-signal output terminals of the plurality of shift registers are connected to the second conductive pattern through fourth via holes penetrating the fourth insulation layer; the conductive patterns comprised in the ones of the plurality of two conductive layers other than the second conductive layer and the third conductive layer are connected through fifth via holes penetrating through the at least one fifth insulation layer; and the plurality of fingerprint recognition scan lines are connected to the third conductive pattern through sixth via holes penetrating through the encapsulation thin film and the sixth insulation layer.

9. The display panel according to claim 6, wherein the first via holes are in a non-display region of the display substrate.

10. The display panel according to claim 3, wherein, both the first electrode plate and the second electrode plate are parallel to the encapsulation thin film.

11. A method for manufacturing a display panel, comprising:
manufacturing a plurality of fingerprint recognition scan lines extending in a row direction and a plurality of fingerprint recognition detection lines extending in a column direction on an encapsulation thin film covering a display substrate, wherein the plurality of fingerprint recognition scan lines intersect the plurality of fingerprint recognition detection lines to define a plurality of fingerprint recognition regions;
manufacturing a fingerprint recognition circuit in each of the plurality of fingerprint recognition regions, wherein the fingerprint recognition circuit is connected to one of the plurality of fingerprint recognition scan lines and one of the plurality of fingerprint recognition detection lines.

12. The method for manufacturing a display panel according to claim 11, wherein, the manufacturing a fingerprint recognition circuit in each of the plurality of fingerprint recognition regions, comprises:
manufacturing a switch transistor and a parallel-plate capacitor in the each of the fingerprint recognition regions; wherein the parallel-plate capacitor comprises a first electrode plate, a second electrode plate, and a dielectric layer between the first electrode plate and the second electrode plate; a gate electrode of the switch transistor is connected to the fingerprint recognition scan line connected to the fingerprint recognition circuit, a first electrode of the switch transistor is connected to the fingerprint recognition detection line connected to the fingerprint recognition circuit, and a second electrode of the switch transistor is connected to the first electrode plate of the parallel-plate capacitor; the second electrode plate of the parallel-plate capacitor is connected to a common voltage input terminal.

13. The method for manufacturing a display panel according to claim 11, wherein, prior to the manufacturing a plurality of fingerprint recognition scan lines extending in a row direction and a plurality of fingerprint recognition detection lines extending in a column direction on the encapsulation thin film covering the display substrate, the method further comprises:
manufacturing a gate driving circuit on the display substrate;
manufacturing a first insulation layer covering the gate driving circuit, and manufacturing the encapsulation thin film covering the first insulation layer;
forming first via holes penetrating the first insulation layer and the encapsulation thin film; and
wherein after the manufacturing a plurality of fingerprint recognition scan lines extending in a row direction and a plurality of fingerprint recognition detection lines extending in a column direction on the encapsulation thin film covering the display substrate, the method further comprises:
connecting gate-driving-signal output terminals of the gate driving circuit to the plurality of fingerprint recognition scan lines on the encapsulation thin film through the first via holes penetrating through the first insulation layer and the encapsulation thin film.

14. The method for manufacturing a display panel according to claim 11, wherein, prior to the manufacturing a plurality of fingerprint recognition scan lines extending in a row direction and a plurality of fingerprint recognition detection lines extending in a column direction on the encapsulation thin film covering the display substrate, the method further comprises:
manufacturing a gate driving circuit on the display substrate;
manufacturing a second insulation layer covering the gate driving circuit, and forming second via holes penetrating through the second insulation layer;
forming a first conductive layer on the second insulation layer, patterning the first conductive layer to form a first conductive pattern; and connecting the gate-driving-signal output terminals of the gate driving circuit to the first conductive pattern through the second via holes; and
manufacturing a third insulation layer covering the first conductive layer, manufacturing the encapsulation thin film covering the third insulation layer, and forming third via holes penetrating the third insulation layer and the encapsulation thin film; and
after the manufacturing a plurality of fingerprint recognition scan lines extending in a row direction and a plurality of fingerprint recognition detection lines extending in a column direction on the encapsulation thin film covering the display substrate, the method further comprises:
connecting the first conductive pattern to the plurality of fingerprint recognition scan lines on the encapsulation thin film through the third via holes.

15. The method for manufacturing a display panel according to claim 11, wherein, prior to the manufacturing a plurality of fingerprint recognition scan lines extending in a row direction and a plurality of fingerprint recognition detection lines extending in a column direction on the encapsulation thin film covering the display substrate, the method further comprises:
manufacturing a gate driving circuit on the display substrate;
manufacturing a fourth insulation layer covering the gate driving circuit, and forming fourth via holes penetrating through the fourth insulation layer;
forming a second conductive layer on the fourth insulation layer, patterning the second conductive layer to form a second conductive pattern; and connecting gate-driving-signal output terminals of the gate driving circuit to the second conductive pattern through the fourth via holes;
manufacturing a fifth insulation layer covering the second conductive pattern, and forming fifth via holes penetrating through the fifth insulation layer;
forming a third conductive layer on the fifth insulation layer, patterning the third conductive layer to form a third conductive pattern; and connecting the second conductive pattern to the third conductive pattern through the fifth via holes;
manufacturing a sixth insulation layer covering the third conductive layer, manufacturing the encapsulation thin film covering the sixth insulation layer, and forming sixth via holes penetrating the sixth insulation layer and the encapsulation thin film; and
after the manufacturing a plurality of fingerprint recognition scan lines extending in a row direction and a plurality of fingerprint recognition detection lines extending in a column direction on the encapsulation thin film covering the display substrate, the method further comprises:

connecting the third conductive pattern to the plurality of fingerprint recognition scan lines on the encapsulation thin film through the sixth via holes.

16. The method for manufacturing a display panel according to claim 13, wherein the first via holes are in a non-display region of the display substrate.

17. The method for manufacturing a display panel according to claim 14, wherein the second via holes and the third via holes are in a non-display region of the display substrate.

18. The method for manufacturing a display panel according to claim 15, wherein the fourth via holes to the sixth via holes are in a non-display region of the display substrate.

19. A display device, comprising:
the display panel according to claim 1.

* * * * *